United States Patent
Lee et al.

(10) Patent No.: US 10,542,646 B2
(45) Date of Patent: Jan. 21, 2020

(54) SURFACE MOUNT METAL UNIT AND ELECTRIC DEVICE INCLUDING SAME

(71) Applicant: Samsung Electronics Co., Ltd, Suwon-si (KR)

(72) Inventors: Chang-Joon Lee, Gwangmyeong-si (KR); Yong-Won Lee, Seongnam-si (KR); Hyun-Tae Jang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 32 days.

(21) Appl. No.: 15/937,646

(22) Filed: Mar. 27, 2018

(65) Prior Publication Data
US 2018/0279516 A1    Sep. 27, 2018

(30) Foreign Application Priority Data
Mar. 27, 2017   (KR) .................. 10-2017-0038771

(51) Int. Cl.
| | |
|---|---|
| *H05K 1/09* | (2006.01) |
| *H05K 9/00* | (2006.01) |
| *H05K 3/30* | (2006.01) |
| *H05K 1/18* | (2006.01) |
| *H05K 1/03* | (2006.01) |
| *H05K 1/05* | (2006.01) |
| *H05K 3/34* | (2006.01) |

(Continued)

(52) U.S. Cl.
CPC ....... *H05K 9/0049* (2013.01); *B23K 35/0238* (2013.01); *B23K 35/262* (2013.01); *B32B 15/013* (2013.01); *B32B 15/018* (2013.01); *C22C 9/04* (2013.01); *C22C 9/06* (2013.01); *C22C 38/40* (2013.01); *H05K 1/0306* (2013.01); *H05K 1/053* (2013.01); *H05K 1/181* (2013.01); *H05K 3/303* (2013.01); *H05K 3/341* (2013.01); *H05K 9/0028* (2013.01); *B23K 2101/42* (2018.08); *H05K 1/0216* (2013.01); *H05K 2201/10318* (2013.01); *H05K 2201/10333* (2013.01); *H05K 2201/10371* (2013.01); *Y02P 70/613* (2015.11)

(58) Field of Classification Search
CPC ........ H01L 23/06; H05K 5/0091; H05K 1/09; H05K 1/092; H05K 1/095; H05K 1/097
See application file for complete search history.

(56) References Cited

U.S. PATENT DOCUMENTS

| | | |
|---|---|---|
| 5,001,546 A | 3/1991 | Butt |
| 6,344,963 B1 | 2/2002 | Mori |

(Continued)

FOREIGN PATENT DOCUMENTS

| | | |
|---|---|---|
| KR | 10-0588929 B1 | 6/2006 |
| KR | 10-1095489 B1 | 12/2011 |
| KR | 10-2016-0068642 A | 6/2016 |

OTHER PUBLICATIONS

European Patent Office, "European Search Report," Application No. EP 18163961.8, dated Aug. 28, 2018, 7 pages.

*Primary Examiner* — Jeremy C Norris

(57) ABSTRACT

According to various embodiments of the present disclosure, a metal unit may include: a core metal layer that is mainly composed of iron (Fe); and an outer layer formed on at least one face of the core metal layer, and bonded to solder so as to be attached to a printed circuit board. The metal unit and an electronic device including the same may be variously implemented according to embodiments.

20 Claims, 11 Drawing Sheets

(51) Int. Cl.
  *B32B 15/01* (2006.01)
  *B23K 35/02* (2006.01)
  *B23K 35/26* (2006.01)
  *C22C 9/04* (2006.01)
  *C22C 38/40* (2006.01)
  *C22C 9/06* (2006.01)
  *H05K 1/02* (2006.01)
  *B23K 101/42* (2006.01)

(56) References Cited

U.S. PATENT DOCUMENTS

| | | |
|---|---|---|
| 7,135,643 B2 | 11/2006 | van Haaster et al. |
| 2003/0227581 A1* | 12/2003 | Sung ................ G02F 1/133308 |
| | | 349/58 |
| 2009/0301749 A1* | 12/2009 | Tanaka ................ H01L 21/4817 |
| | | 174/50.5 |
| 2013/0148318 A1 | 6/2013 | Kim |
| 2014/0027171 A1 | 1/2014 | Song et al. |
| 2016/0233027 A1 | 8/2016 | Iijima et al. |

\* cited by examiner

SURFACE MOUNT METAL UNIT AND ELECTRIC DEVICE INCLUDING SAME

CROSS-REFERENCE TO RELATED APPLICATION

This application is based on and claims priority under 35 U.S.C. § 119 to Korean Patent Application No. 10-2017-0038771 filed on Mar. 27, 2017, in the Korean Intellectual Property Office, the disclosure of which is incorporated by reference herein in its entirety.

BACKGROUND

1. Field

Various embodiments of the present disclosure relate to a surface mount metal unit, and an electronic device including the same.

2. Description of the Related Art

An electronic device, such as a portable terminal, may be provided with a printed circuit board on which components for implementing various functions of the electronic device may be mounted. Various component elements, for example, electronic components, such as a transistor, a diode, a resistor, and an integrated circuit chip, and mechanical components, such as a SIM card socket and a shield can may be mounted on a printed circuit board.

SUMMARY

Mechanical components mounted on a printed circuit board can be bonded by coating melted solder on the printed circuit board and cooling the melted solder (or melting and curing solder). For example, a Sn—Ag—Cu based material is used for such a solder. Due to the material used for the solder, the material of mechanical components to be bonded to the printed circuit board is limited, and for example, a Cu—Ni—Zn based nickel silver (or German silver) may be used.

In addition, as the degree of integration of electronic devices increases, printed circuit boards or electronic components, mechanical components, and the like mounted on the printed circuit boards are being miniaturized and thinned. Even though thinned printed circuit boards may meet the trend of downsizing and thinning of electronic devices, the frequency of connection defects may increase in a surface mounting process. For example, in the process of heating the solder or the printed circuit board, the thinned printed circuit board may be easily bent or distorted. Further, even though the printed circuit board may be thinned, the mechanical components mounted on the printed circuit board may need to have high strength. However, a material, such as a nickel silver used for a mechanical component, has a maximum tensile strength of about 600 MPa, which is low in strength, and cannot be easily processed, and thus it is not easy to implement a complicated shape.

Various embodiments of the disclosure provide a metal unit, which can be processed so as to improve the strength and processability of a mechanical component mounted on a printed circuit board, and can be soldered to a printed circuit board with a Sn—Ag—Cu based material. Further, the various embodiments also provide an electronic device including the metal unit.

Various embodiments of the disclosure provide a metal unit that can be soldered efficiently while reducing the unit cost of a mechanical component mounted on a printed circuit board. Further, various embodiments of the present disclosure also provide an electronic device including the metal unit.

Various embodiments of the disclosure provide a metal unit which is improved in strength and processability in comparison with the existing nickel silver, and can maintain flatness when mounted on a thin printed circuit board. Further, various embodiments of the present disclosure also provide an electronic device including the metal unit.

According to various embodiments of the present disclosure, a surface mount metal unit may include a core metal layer that is mainly composed of iron (Fe), and an outer layer formed on at least one face of the core metal layer, and bonded to solder so as to be attached to a printed circuit board.

According to various embodiments of the disclosure, a printed circuit board assembly structure may include a printed circuit board, a mechanical component bonded to the printed circuit board and formed of a metal unit having a plurality of metal layers, and solder bonding the mechanical component and the printed circuit board to each other.

The metal unit may include a core metal layer that is mainly composed of iron (Fe), and an outer layer formed on at least one face of the core metal layer, and bonded to the solder so as to be attached to the printed circuit board.

According to various embodiments of the disclosure, an electronic device may include a housing, a display exposed through a first face of the housing, a printed circuit board positioned within the housing, a mechanical component bonded to the printed circuit board and formed of a metal unit having a plurality of metal layers, and solder bonding the mechanical component and the printed circuit board to each other.

The metal unit may include a core metal layer that is mainly composed of iron (Fe), and an outer layer formed on at least one face of the core metal layer, and bonded to the solder so as to be attached to the printed circuit board.

In a surface mount metal unit and an electronic device including the same according to various embodiments of the present disclosure, the metal unit is formed to include a plurality of layers, in which by providing a core metal layer as the central layer of the metal unit, which is formed of a material that is mainly composed of iron (Fe), and providing an outer layer outside the core metal layer, which is formed of a material capable of being easily bonded to solder containing, e.g., a material containing copper (Cu)-nickel (Ni)-zinc (Zn), it is possible to provide a metal unit, which is improved in strength, has high processability, and is easily bondable to solder in comparison with the existing metal unit, which is formed of only nickel silver.

In a surface mount metal unit and an electronic device including the same according to various embodiments of the present disclosure, the strength of the metal unit forming a metal component improved. Thus, when the metal component is mounted on a thinned printed circuit board, the flatness of the printed circuit board can be maintained. For example, even if there is a factor of deformation of the printed circuit board, such as expansion when the printed circuit board is heated for soldering, the printed circuit board can be maintained in the form of a flat plate.

With a surface mount metal unit and an electronic device including the same according to various embodiments of the present disclosure, since a core metal layer as the central layer of the metal unit is formed of a material that is mainly composed of iron (Fe), it is possible to reduce the unit cost in comparison with the existing metal unit, which has been formed only of relatively expensive nickel silver.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1A:
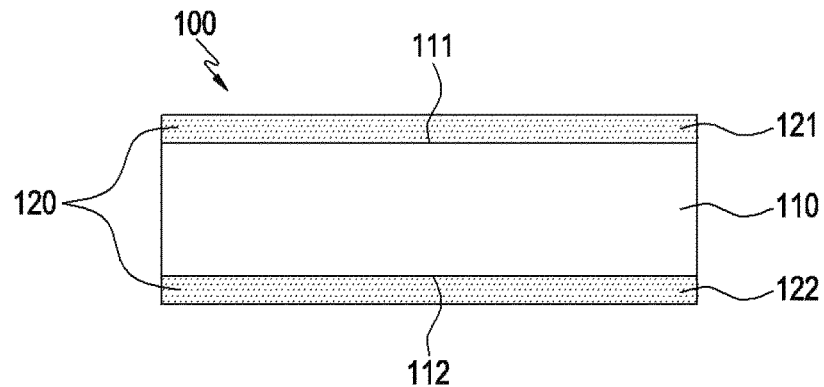
FIGS. 1A to 1C are cross-sectional views of a metal unit illustrating a metal unit soldered to a printed circuit board according to various embodiments of the present disclosure.

FIGS. 1A through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

As the present disclosure allows for various changes and numerous embodiments, some exemplary embodiments will be described in detail with reference to the accompanying drawings. However, the embodiments do not limit the present disclosure to a specific implementation, but should be construed as including all modifications, equivalents, and replacements included in the spirit and scope of the present disclosure.

Although ordinal terms such as "first" and "second" may be used to describe various elements, these elements are not limited by the terms. The terms are used merely for the purpose to distinguish an element from the other elements. For example, a first element could be termed a second element, and similarly, a second element could be also termed a first element without departing from the scope of the present disclosure. As used herein, the term "and/or" includes any and all combinations of one or more associated items.

Further, the relative terms "a front surface", "a rear surface", "a top surface", "a bottom surface", and the like which are described with respect to the orientation in the drawings may be replaced by ordinal numbers such as first and second. In the ordinal numbers such as first and second, their order are determined in the mentioned order or arbitrarily and may not be arbitrarily changed if necessary.

In the present specification, the terms are merely used to describe a specific embodiment, and are not intended to limit the present disclosure. As used herein, the singular forms are intended to include the plural forms as well, unless the context clearly indicates otherwise. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined otherwise, all terms used herein, including technical and scientific terms, have the same meaning as commonly understood by those of skill in the art to which the present disclosure pertains. Such terms as those defined in a generally used dictionary are to be interpreted to have the meanings equal to the contextual meanings in the relevant field of art, and are not to be interpreted to have ideal or excessively formal meanings unless clearly defined in the present specification.

Figure 1B:
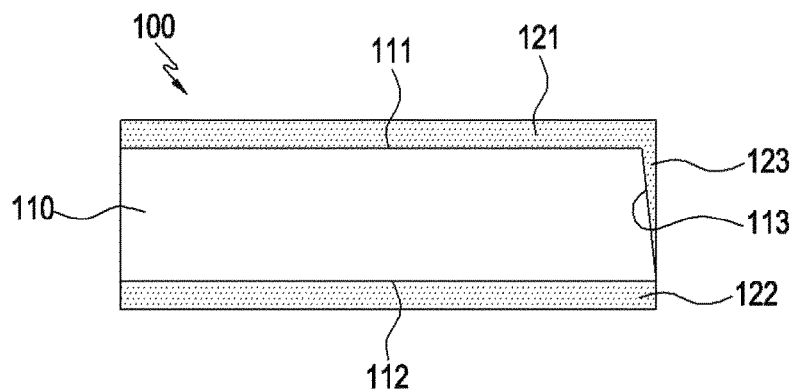
Figure 1C:
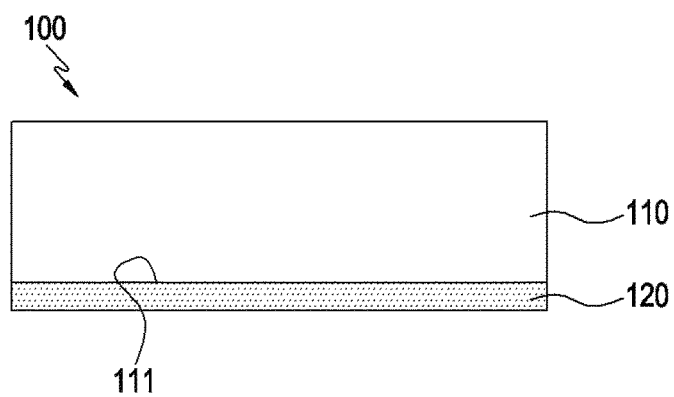
Figure 2A:
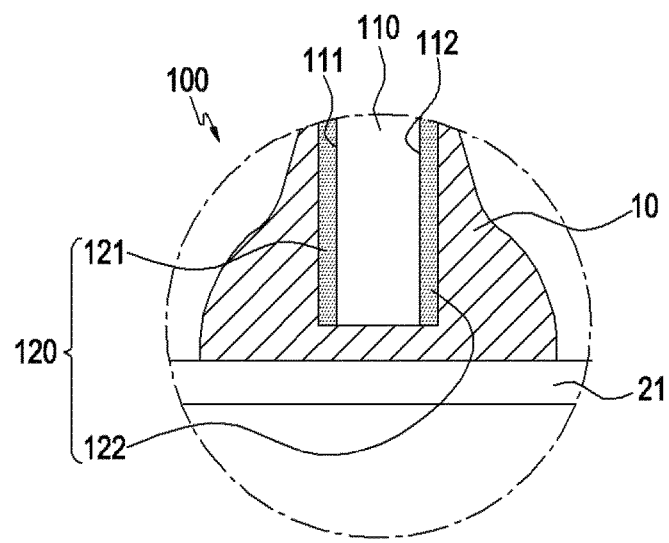
FIGS. 2A to 2C are views illustrating a state in which the metal unit is formed into a mechanical component and is soldered to the printed circuit board according to various embodiments of the present disclosure.
Figure 2B:
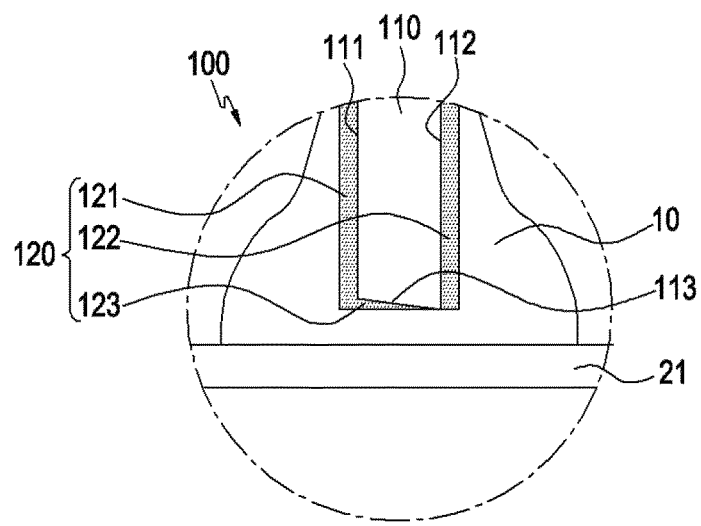
Figure 2C:
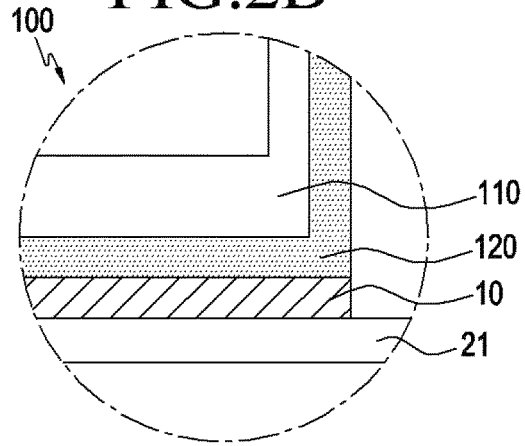

FIGS. 1A to 1C are cross-sectional views of a metal unit 100 illustrating the metal unit 100 soldered to a printed circuit board 21 according to various embodiments of the present disclosure. FIGS. 2A to 2C are views illustrating a state in which the metal unit 100 is formed into a mechanical component and is soldered to the printed circuit board 21 according to various embodiments of the present disclosure.

Referring to FIGS. 1A to 1C and FIGS. 2A to 2C, the metal unit 100 according to various embodiments of the present disclosure may form a mechanical component which has a plurality of layers and is soldered to the printed circuit board 21. For example, various electronic elements or mechanical components may be mounted on the printed circuit board 21. The electronic elements may include, for example, a transistor, a diode, a resistor, an integrated circuit chip. The mechanical components include, for example, a shield can for shielding electromagnetic waves of an electronic element or the like and preventing electromagnetic wave interference, a shield can-fixing unit for fixing the shield can to the printed circuit board 21, a socket cover of a socket device for mounting an SIM card, and a surface mount plate for supporting or fixing the thinned printed circuit board 21.

According to various embodiments, a mechanical component mounted on the printed circuit board 21 may be formed of a metal unit 100, and the metal unit 100 may be formed of a plurality of metal layers.

According to various embodiments, the metal unit 100 may include a core metal layer 110 and an outer layer 120 formed on at least one face of the core metal layer 110. The core metal layer 110 may be formed in the center of the metal unit 100 and may improve the strength and processability of the metal unit 100. The outer layer 120 is bonded to the solder 10 so that the metal unit 100 can be mounted on the printed circuit board 21. In various embodiments, the mechanical component formed by processing the metal unit may be bonded to the printed circuit board 21 via the solder 10. In various embodiments, the description "bonding via the solder 10" may include both of "soldering through the solder 10" and "reflow soldering through a solder cream."

In various embodiments, the core metal layer 110 may include an alloy, which is mainly composed of iron (Fe). For example, the core metal layer 110 may be made of an alloy, which is mainly composed of iron (Fe) and contains about 17 to 19 wt % of chromium (Cr) and about 7 to 9 wt % of nickel (Ni).

In various embodiments, the outer layer 120 may be bonded to the surface of the core metal layer 110 and form the outermost layer of the core metal layer 110. The outer layer 120 may be made of a material with which the core metal layer 110 can be clad. For example, the outer layer 120 may be bonded to the core metal layer 110 by hot rolling. The outer layer 120 may be made of a material having predetermined strength and elongation such that the core metal layer 110 can be clad with the material during the hot rolling. In one embodiment, the outer layer 120 may be formed of a material that is bondable to the solder 10 and has good corrosion resistance. For example, the metal unit 100 may be etched or pressed to be formed into a mechanical component that is mounted on a printed circuit board 21 of an electronic device such as a portable terminal or a Portable Multimedia Player (PMP). The outer layer 120 may be formed to have corrosion resistance so as to satisfy the reliability test standard of the above-mentioned electronic devices.

In various embodiments, as in FIG. 2A, the outer layer 120 may be provided on a first face 111 of the core metal layer 110 and on a second face 112 of the core metal layer 110, which is opposite the first face 111. For example, the outer layer 120 may include a first outer layer 121 and a second outer layer 122. In the metal unit 100, in respect to the core metal layer 110 as a center, the first face 111 of the core metal layer 110 may be clad with the outer layer 121 and the second face 112 of the core metal layer 110 may be clad with the second outer layer 122.

In another embodiment, as in FIG. 2B, the outer layer 120 may be provided on a first face 111 of the core metal layer 110, on a second face 112 of the core metal layer 110, which is opposite the first face 111, and on a third face 113 between the first face 111 and the second face 112. For example, the outer layer 120 may include a first outer layer 121, a second outer layer 122, and a third outer layer 123. In respect to the core metal layer 110 as a center, the first face 111 of the core metal layer 110 may be clad with the first outer layer 121, the second face 112 of the core metal layer 110 may be clad with the second outer layer 122, and the third outer layer 123 may be formed on a least a portion of the third face 113 between the first face 111 and the second face 112 of the core metal layer 110. In one embodiment, the third outer layer 123 may be clad to the core metal layer 110. In another embodiment, the third outer layer 123 may be formed by being plated or coated. In still another embodiment, the third outer layer 123 may be formed on the third face 113 of the core metal layer 110 as the metal unit 100 is cut. For example, the metal unit 100 may be formed to include two or three metal layers, and processing, such as cutting, may be performed so as to form a mechanical component. When the metal unit 100 is cut in the process of processing, one of the first outer layer 121 and the second outer layer 122, which are clad to one end of the core metal layer 110, is clad to a side face of the core metal layer 110 (the third face 113 of the core metal layer 110). Since the outer layer 120 can be formed up to the third face 113 together with the first face 111 and the second face 112 of the metal unit 100, the reliability of bonding can be improved when the metal unit 100 is bonded via the solder 10.

In another embodiment, as in FIG. 2C, the outer layer 120 may be clad on one face of the core metal layer 110 (e.g., a face that is in contact with the printed circuit board 21 and is bonded to the printed circuit board via the solder 10). For example, the mechanical component formed by processing the metal unit 100 may be formed such that one face of the mechanical component is in contact with the printed circuit board 21. In this case, the outer layer 120 may be formed on one of the first face 111 and the second face 112 of the metal unit 100 to which the solder 10 is bonded.

In one embodiment, so that the mechanical component formed by processing the metal unit 100 can be easily bonded to the solder 10 while having strength and processability, the metal unit 100 in which the core metal layer 110 and the outer layer 120 are bonded to each other, may be formed to have a predetermined thickness ratio between the layers. In one embodiment, when the metal unit 100 is formed of three metal layers, assuming that the total thickness of the metal unit 100 is "1," the thickness ratio of "the first outer layer 121:the core metal layer 110:the second outer layer 122" may be formed in the range of "0.1 to 0.25:0.50 to 0.8:0.1 to 0.25." In one embodiment, "the first outer layer 121:the core metal layer 110:the second outer layer 122" may be formed to have a thickness ratio in the range of "0.15:0.70:0.15." For example, since the thickness ratio of the outer layer 120 may be 0.15 or less, the overall strength and processability of the metal unit 100 can be advantageously improved.

In another embodiment, when the metal unit 100 is formed of two metal layers, assuming that the total thickness of the metal unit 100 is "1," the thickness ratio of "the outer layer 120:the core metal layer 110" may be formed in the range of "0.1 to 0.25:0.75 to 0.9." In one embodiment, "the outer layer 120:the core metal layer 110" may be formed to have a thickness ratio in the range of "0.15:0.85." For example, since the thickness ratio of the outer layer 120 may be 0.15 or less, the overall strength and processability of the metal unit 100 can be advantageously improved.

In various embodiments, the outer layer 120 may be formed of an alloy including copper (Cu)-nickel (Ni)-zinc (Zn) such that the outer layer 120 can be easily bonded when it is soldered with the solder 10, which is formed of an alloy including tin (Sn)-silver (Ag)-copper (Cu). In various embodiments, the outer layer 120 may be made of a material that can be bonded to the solder 10, and the first outer layer 121 and the second outer layer 122 may be made of the same material or may be made of different materials. For example, the outer layer 120 may be made of an alloy including 40 to 70 wt % of copper (Cu), 5 to 30 wt % of nickel (Ni), and 10 to 45 wt % of zinc (Zn).

In another embodiment, the outer layer 120 may be made of nickel silver (German silver) or phosphor bronze.

In various embodiments, when the metal unit 100 is formed of three layers of the first outer layer 121, the core metal layer 110, and the second outer layer 122 (see FIGS. 2A to 2C), the metal unit 100 may be formed such that the first outer layer 121/the core metal layer 110/the second outer layer 122 may be formed to include nickel silver (German silver)/an alloy including iron (Fe)/nickel silver (German silver), respectively. In another embodiment, in the metal unit 100, the first outer layer 121/the core metal layer 110/the second outer layer 122 may be formed of phosphor bronze/an alloy containing iron (Fe)/phosphor bronze, respectively. In still another embodiment, in the metal unit 100, the first outer layer 121/the core metal layer 110/the second outer layer 122 may be formed of nickel silver (German silver)/an alloy containing iron (Fe)/phosphor bronze, respectively.

In various embodiments, when the metal unit 100 is formed of two layers of one outer layer 120 and the core metal layer 110 (see FIG. 2C), the metal unit 100 may be formed such that the outer layer 120/the core metal layer 110 may be formed to include nickel silver (German silver)/an allow including iron (Fe), respectively. In another embodiment, in the metal unit 100, the outer layer 120/the core metal layer 110 may be formed of phosphor bronze/an alloy containing iron (Fe), respectively.

In the following detailed description, various embodiments of the mechanical component formed of the metal unit 100 may be described. In the following description, the components that are substantially the same as those of the preceding embodiments or can be easily understood through the preceding embodiments may be denoted by the same reference numerals as those in the preceding embodiments or the reference numerals may be omitted, and the detailed description thereof may be omitted. For example, as mentioned above, the printed circuit boards 21 may be given the same reference numerals. For example, even if the metal unit 100 has a configuration, which is formed of a plurality of layers of the core metal layer 110 and the outer layer 120, or the thickness ratio thereof is not mentioned, these configurations may be combined with or replaced by the configurations of the preceding embodiments.

Figure 3:
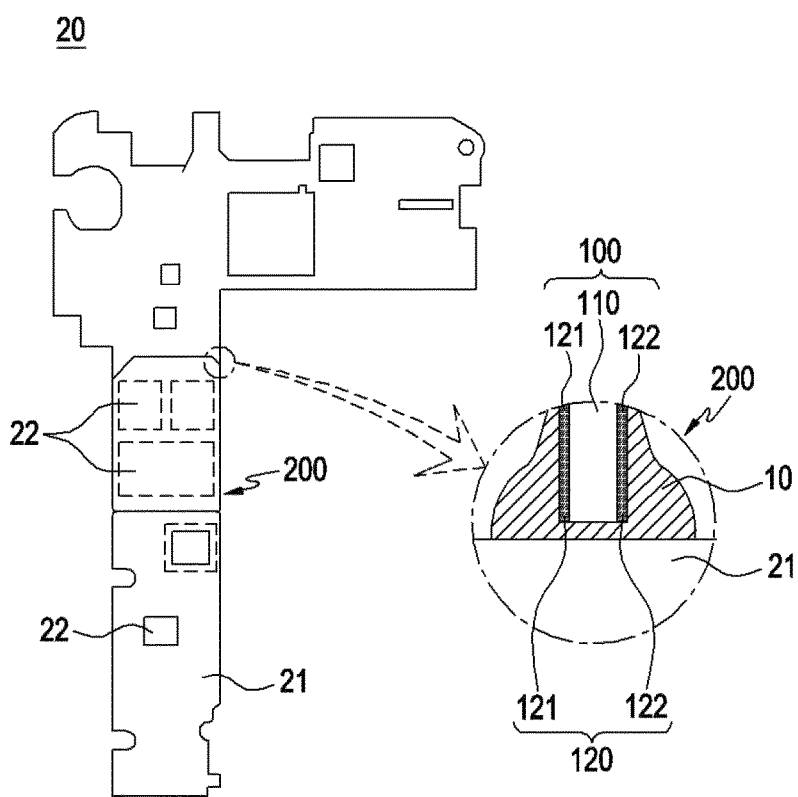
FIG. 3 is a plan view illustrating a state in which a surface mount metal unit is formed into a shield can in an electronic device according to various embodiments of the present disclosure and is mounted on a printed circuit board.
Figure 4:
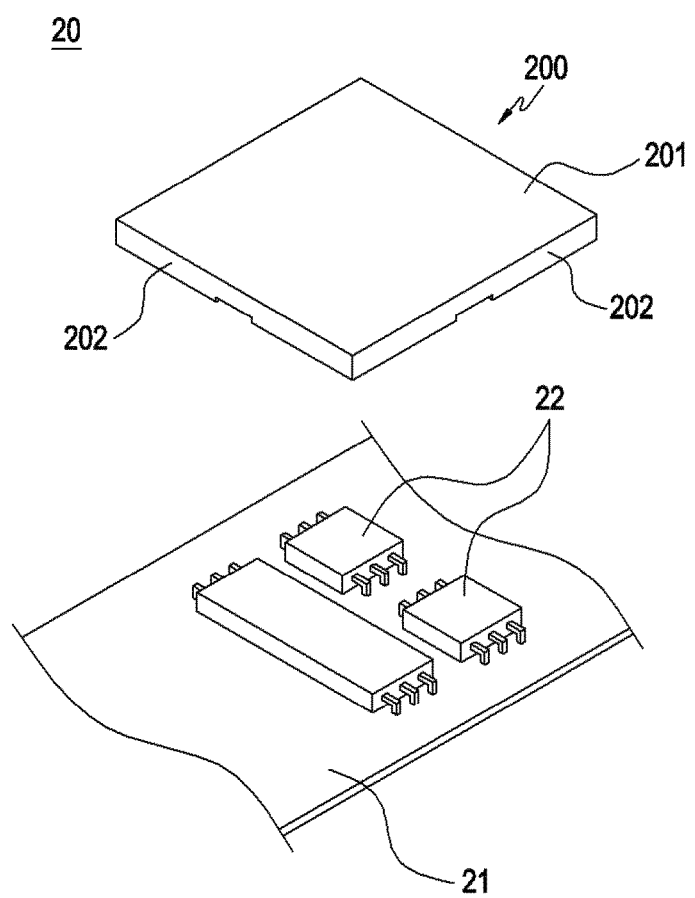
FIG. 4 is a perspective view illustrating a state before a shield can is mounted on a printed circuit board in an electronic device according to various embodiments of the present disclosure.
Figure 5:
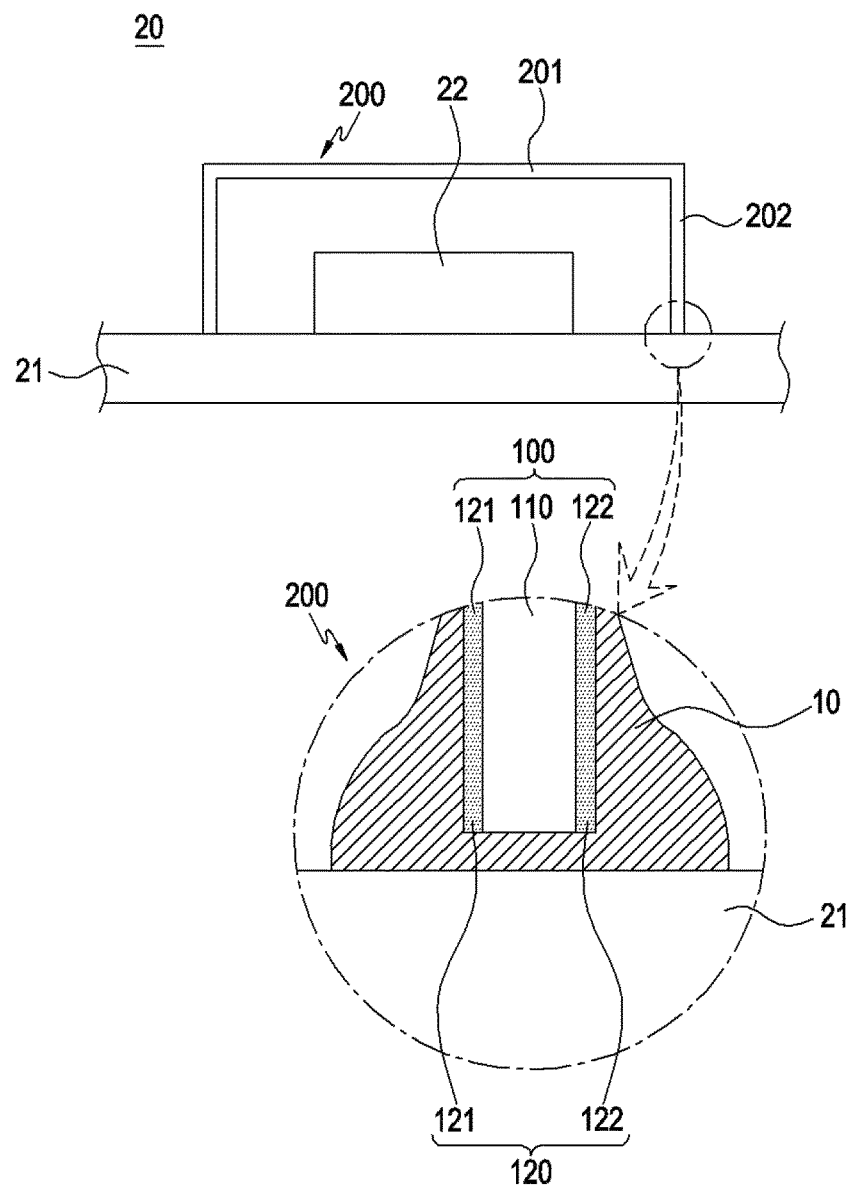
FIG. 5 is a view illustrating a bonded state of a metal unit, solder, and a printed circuit board in a state in which a shield can is mounted on a printed circuit board in an electronic device according to various embodiments of the present disclosure.

FIG. 3 is a plan view illustrating a state in which the metal unit 100 is formed into a shield can 200 and mounted on the printed circuit board 21 in the electronic device 20 according to various embodiments of the present disclosure. FIG. 4 is a perspective view illustrating a state before the shield can 200 is mounted on the printed circuit board 21 in the electronic device 20 according to various embodiments of the present disclosure. FIG. 5 is a perspective view illustrating a state where the shield can 200 is mounted on the printed circuit board 21 in the electronic device 20 according to various embodiments of the present disclosure, in which the bonded state of the metal unit 100, the solder 10, and the printed circuit board 21 is illustrated.

Referring to FIGS. 3 through 5, in various embodiments, the metal unit 100 may be formed into a shield can 200 for electromagnetic interference (EMI) shield and component protection of an electronic element, such as a transistor, a diode, a resistor, or an integrated circuit chip, which is mounted on the printed circuit board 21. In one embodiment, the shield can 200 may be formed in a cover shape, which has four side walls with one opened side, through a processing process, such as etching or pressing, of the metal unit 100 (e.g., the metal unit of FIG. 2A and FIG. 2B) in which, in respect to the core metal layer 110 as a central layer, the outer layer 120 is bonded to the first face 111 and the second face 112 of the core metal layer 110. In various embodiments, the shield can 200 has a cover shape, which has four sidewalls with one opened side, and the shield can 200 is formed to have the structure of the metal unit 100 in the portion, which is bonded to the printed circuit board 21 via the solder 10, in the shape of the shield can 200. For example, the shield can 200 may include a first member 201 positioned above an electronic element 22 and four side walls 202 along the periphery of the first member 201, and each of the portions of the four side walls 202, which are bonded to the printed circuit board 21 via the solder 10, may be formed into the metal unit 100, in which the core metal layer 110 and the outer layer 120 on at least one face of the core metal layer 110 are formed.

In one embodiment, the shield can 200 may be bonded to the printed circuit board 21 via the solder 10 while covering the electronic element 22. For example, the solder 10 may be applied along the edge of the four side walls 202 of the shield can 200 so as to bond the shield can 200 to the printed circuit board 21. In one embodiment, since the outer layer 120, which forms the outermost layer of the shield can 200, such as the first outer layer 121 or the second outer layer 122, is formed of a material, to which the solder 10 is easily bonded, such as nickel silver or phosphor bronze, the solder 10 can be easily bonded to the outermost layer of the shield can 200.

Figure 6:
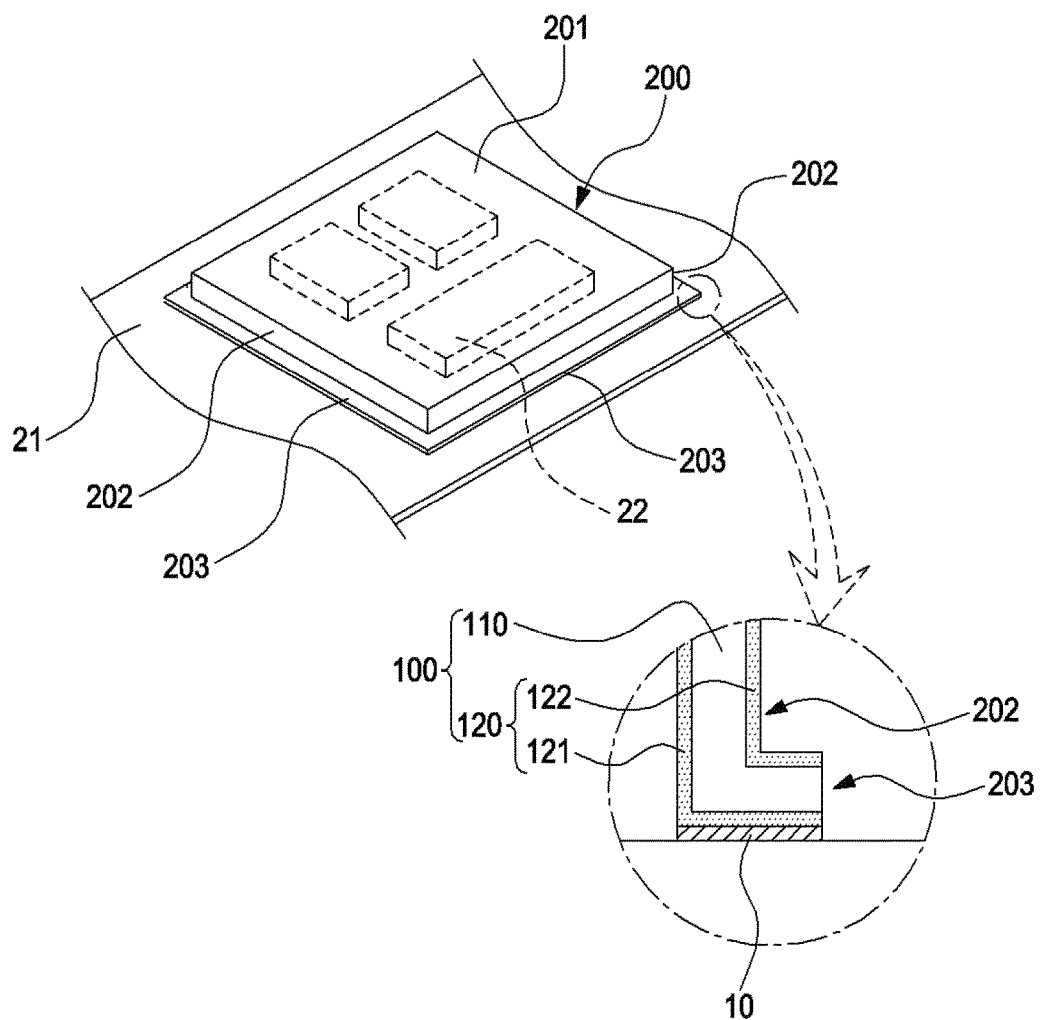
FIG. 6 is a view illustrating another shape of a shield can, which is formed of a metal unit in an electronic device according to various embodiments of the present disclosure.

FIG. 6 is a view for explaining another shape of a shield can 200, which is formed of a metal unit 100 in an electronic device according to various embodiments of the present disclosure.

Referring to FIG. 6, in various embodiments, the shield can 200 may include a first member 201 and four side walls 202 along the periphery of the first member 201 as one side of the shield can 200 is opened, and a bonding flange 203 may be formed in each of the four side walls 202 so as to be in contact with the printed circuit board 21.

In one embodiment, the shield can 200 (e.g., the first member 201, the four side walls 202, and the bonding flanges 203) may be formed of the metal unit 100. In another embodiment, in the shield can 200 (e.g., the first member 201, the four side walls 202, and the bonding flanges 203), the bonding flanges 203, which are bonded to the printed circuit board 21 via the solder 10, may be formed of the structure of the metal unit 100. For example, the bonding flanges 203 may be formed of a metal unit 100 (e.g., the metal unit in FIG. 2C) in which, in respect of a core metal layer 110 as a center, the outer layer 120 is formed on one face of the core metal layer 110, which comes into contact with the printed circuit board 21. In one embodiment, the shield can 200 has high strength and good processability due to the core metal layer 110 including iron (Fe), and the outer layers 120 of the bonding flanges 203 can be easily mounted on the printed circuit board 21 via the solder 10 in the state of facing the printed circuit board 21.

Figure 7:
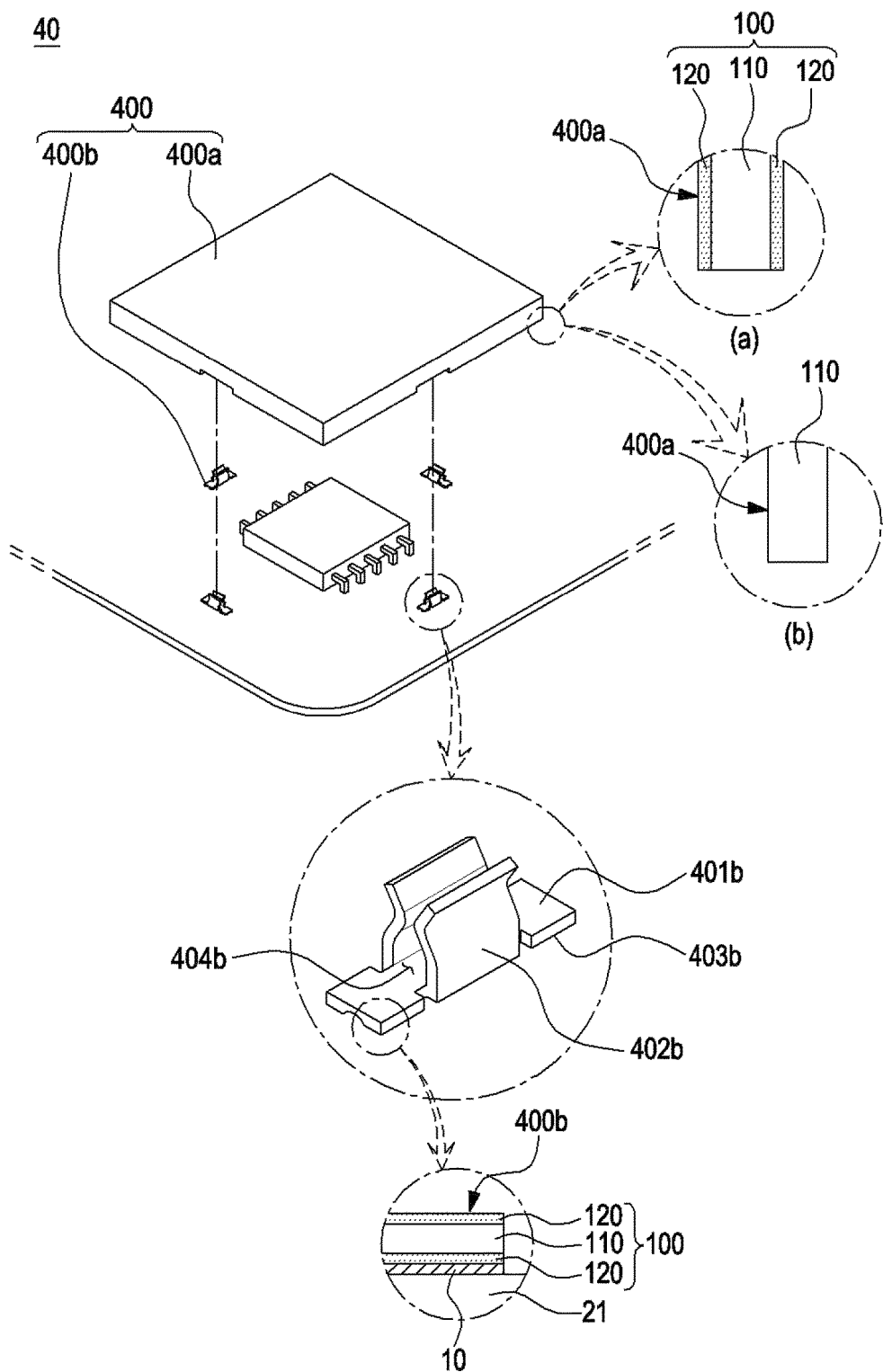
FIG. 7 is a perspective view illustrating a state in which a shield can-fixing unit and a shield can, which are formed of a metal unit, are mounted on a printed circuit board in an electronic device according to various embodiments of the present disclosure.

FIG. 7 is a perspective view illustrating a state in which a shield can-fixing unit and a shield can 400a, which are formed of a metal unit 100, are mounted on a printed circuit board 21 in an electronic device 40 according to various embodiments of the present disclosure.

Referring to FIG. 7, the metal unit 100 according to various embodiments may be processed so as to form a shield can-fixing unit 400b. The shield can-fixing unit 400b may be soldered to the printed circuit board 21 in order to fix the shield can 400a for the purpose of EMI shielding and component protection of electronic elements 22 attached to the printed circuit board 21. In one embodiment, the shield can-fixing unit 400b may be formed in a clip shape through a processing process, such as etching or pressing, of the metal unit 100 (e.g., the metal unit in FIGS. 2A to 2C) in which, in respect of the core metal layer 110 as a central layer, the outer layer 120 is bonded to the outermost portion of the core metal layer 110. In one embodiment, the shield can-fixing unit 400b may be formed by processing the metal unit 100, and the shield can-fixing unit 400b may include a base 401b which is bonded to the printed circuit board 21 via the solder 10 and clip portions 402b, which extend from the base 401b to face each other such that the side wall of the shield can 400a can be seated in and supported by the clip portions 402b. In one embodiment, the shield can-fixing unit 400b may be provided such that a bottom face 403b of the base 401b is bonded to the solder 10. For example, the metal unit 100, which forms the shield can-fixing unit 400b, may include the core metal layer 110 and the outer layer 120 formed on at least one of the first face 111 and the second face 112 of the core metal layer 110. The metal unit 100 may be processed such that the outer layer 120 of the metal unit 100 forms the outer face of the shield can-fixing unit 400b. Since the outer layer 120 is positioned on the bottom face 403b of the base 401b and thus the bottom face 403b of the base 401b is made of a material, which is easily bonded to the solder 10, such as nickel silver or phosphor bronze, the bottom face 403b of the shield can-fixing unit 400b can be easily bonded to the printed circuit board 21 via the solder 10.

In various embodiments, the shield can 400a fixed to the shield can-fixing unit 400b may be formed by processing the metal unit 100. In another embodiment, the shield can 400a may be formed by processing a metal material, which is different from that of the metal unit 100. For example, the shield can 400a may be formed of the core metal layer 110.

Figure 8:
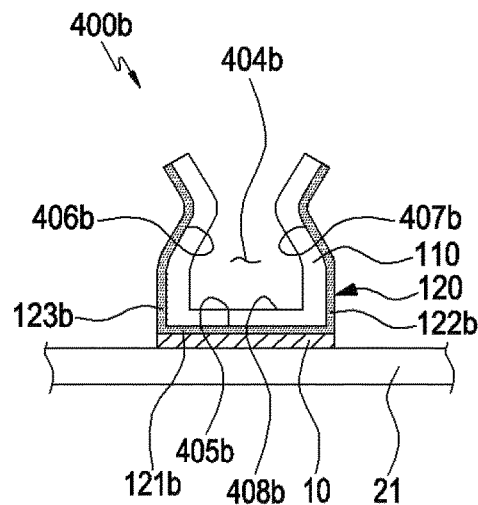
FIG. 8 is a cross-sectional view schematically illustrating a bonded state of a shield can-fixing unit, which is formed of a metal unit, in an electronic device according to various embodiments of the present disclosure.
Figure 9:
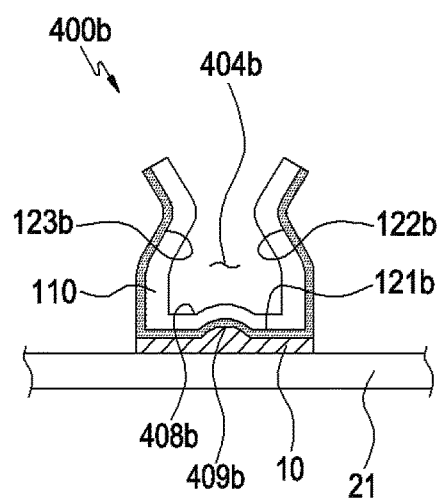
FIG. 9 is a cross-sectional view schematically illustrating another bonded state of a shield can-fixing unit, which is formed of a metal unit, in an electronic device according to various embodiments of the present disclosure.

FIG. 8 is a cross-sectional view schematically illustrating a bonded state of a shield can-fixing unit, which is formed of a metal unit, in an electronic device according to various embodiments of the present disclosure. FIG. 9 is a cross-sectional view schematically illustrating another bonded state of a shield can-fixing unit, which is formed of a metal unit, in an electronic device according to various embodiments of the present disclosure.

Referring to FIGS. 8 and 9, the shield can-fixing unit 400b according to various embodiments may be formed by processing the metal unit 100, for example, the metal unit 100 having the core metal layer 110 and the outer layer 120, which is clad to one face of the core metal layer 110 (e.g., the metal unit of FIG. 2C). The outer layer 120 may be formed on a first face 405b, a second face 406b, and a third face 407b of the core metal layer 110.

For example, the shield can-fixing unit 400b may be formed of the base 401b and the clip portions 402b. A first outer layer 121b may be formed on the first face 405b of the core metal layer 110 (the portion forming the base 401b). A second outer layer 122b may be formed on the third face 407b of the core metal layer 110 (one of the clip portions 402b formed to face each other). A third outer layer 123b may be formed on the second face 406b of the core metal layer 110 (another one of the clip portions 402b formed to face each other). The solder 10 is bonded to the first outer layer 121b so that the shield can-fixing unit 400b can be mounted on the printed circuit board 21. In addition, an accommodation groove 404b may be formed on a fourth face 408b, which is opposite the first face 405b of the core metal layer 110. The shield can (see the shield can 400a in FIG. 7) can be seated in and fixed to the accommodation groove 404b.

In various embodiments, referring to FIG. 9, a groove 409b, which is recessed by a predetermined depth, may be formed in the bottom face 403b of the base 401b. Since the groove 409b is filled with the solder 10, the reliability of the bonding between the shield can-fixing unit 400b and the printed circuit board 21 can be improved.

Figure 10:
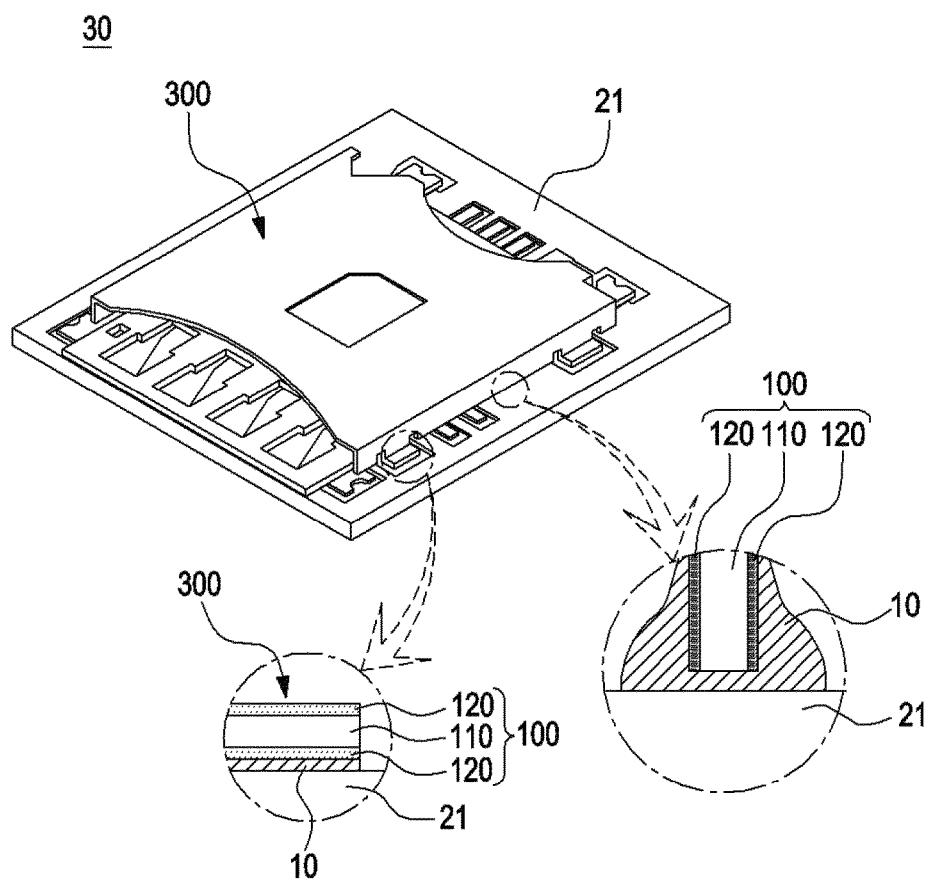
FIG. 10 is a view illustrating a socket device, which is formed of a metal unit in an electronic device according to various embodiments of the present disclosure.

FIG. 10 is a view illustrating a socket device, which is formed of a metal unit 100 in an electronic device 30 according to various embodiments of the present disclosure.

Referring to FIG. 10, the socket device according to various embodiments may include a socket cover 300 spaced apart from the surface of the printed circuit board 21 by a predetermined distance so as to form an accommodation space for mounting a memory, such as a SIM card, therein. In one embodiment, the socket cover 300 may be electrically connected to the printed circuit board 21 via the solder 10. The socket cover 300 according to one embodiment may be formed of the metal unit 100. In the metal unit 100, which forms the socket cover 300 according to one embodiment, the core metal layer 110 may be formed, and in respect to the core metal layer 110 as a center, the outer layers 120 (also refer to FIG. 2A) may be formed on the first face 111 of the core metal layer 110 and the second face 112, which is opposite the first face 111 of the core metal layer 110. In another embodiment, in the metal unit 100, which forms the socket cover 300, the core metal layer 110 may be formed, and in respect to the core metal layer 110 as a center, the outer layers 120 (also refer to FIG. 2B) may be formed on the first face 111, the second face 112, and the third face 113 of the core metal layer 110. In another embodiment, in the metal unit 100, which forms the socket cover 300, the core metal layer 110 may be formed, and the outer layer 120 (also refer to FIG. 2C) may be formed on the first face 111 of the core metal layer 110. Since the outer layer 120, which forms the surface of the socket cover 300, is formed of a material, which is easily bonded to the solder 10, such as nickel silver or phosphor bronze, the socket cover 300 can be easily bonded to the printed circuit board 21 via the solder 10.

Figure 11:
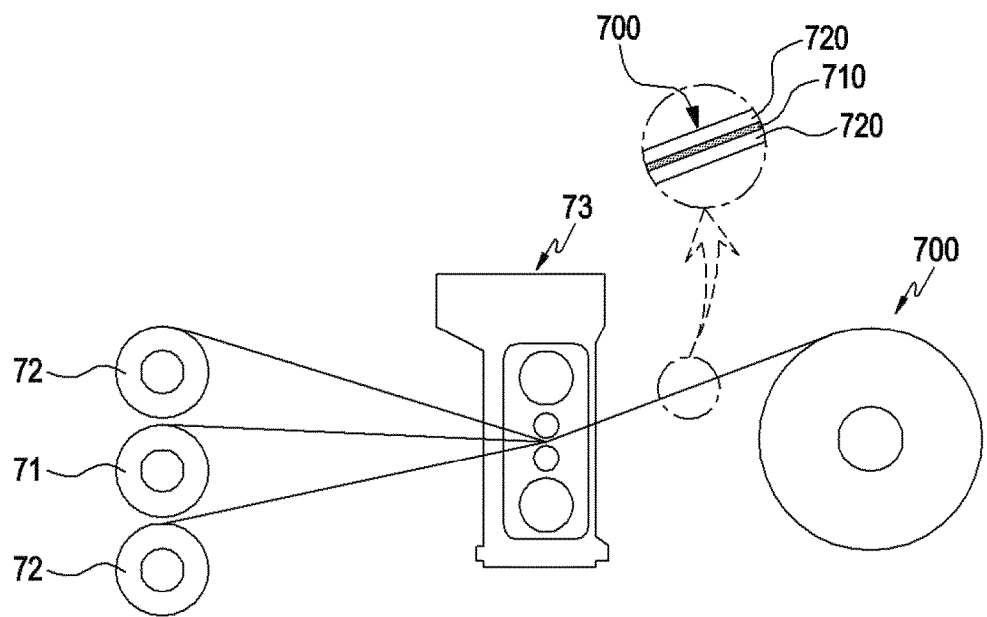
FIG. 11 is a view illustrating a manufacturing process of a surface mount metal unit according to various embodiments of the present disclosure.
Figure 12:
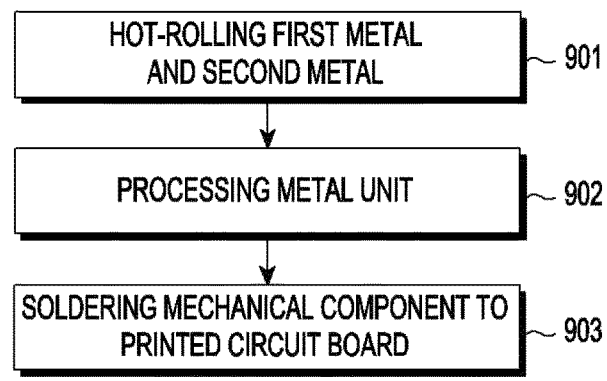
FIG. 12 is a view illustrating a process in which a mechanical component, which is formed of a surface mount metal unit according to various embodiments of the present disclosure, is soldered to a printed circuit board.

FIG. 11 is a view illustrating a manufacturing process of a surface mount metal unit 700 (e.g., the metal unit 100 in FIG. 1) according to various embodiments of the present disclosure. FIG. 12 is a view illustrating a process in which a mechanical component, which is formed of a surface mount metal unit (e.g., the metal unit 100 in FIG. 1) according to various embodiments of the present disclosure, is soldered to a printed circuit board 21.

Referring to FIGS. 11 and 12, a surface mount metal unit 700 according to various embodiments may be fabricated by bonding a first metal 71 that forms a core metal layer 710

(also refer to the core metal layer 110 in FIG. 1) and a second metal 72 that forms an outer layer 720 (also refer to the outer layer 120 in FIG. 1) to each other while causing the first metal 71 and the second metal 72 to pass through a hot-rolling jig 73. For example, the first metal 71 and the second metal 72 may be bonded to each other by providing the first metal 71 and the second metal 72, which is positioned on at least one side of the first metal 71 (step 901), and causing the first metal 71 and the second metal 72, which are superimposed one on another, to pass through a compression roller heated to a high temperature (e.g., about 250° C.). The first metal 71 and the second metal 72, which have been bonded to each other at a high temperature and a high pressure, may be processed and annealed a desired mechanical component dimension by being repeatedly rolled. In one embodiment, by rolling the first metal 71 and the second metal 72, it is possible to form the surface mount metal unit 700 (also refer to the metal unit 100 in FIG. 1) in which the outer layer 720 (also refer to the outer layer 120 in FIG. 1), the core metal layer 710 (also refer to the core metal layer 110 in FIG. 1), and the outer layer 720 (also refer to the outer layer 120 in FIG. 1) have a thickness ratio of 0.15:0.70:0.15.

The metal unit 100 processed through the hot-rolling jig 73 may be formed to have a shape of a mechanical component through etching or pressing (step 902). The mechanical component formed by processing the metal unit 100 may be mounted on the printed circuit board 21 by being soldered to the printed circuit board 21 (step 903).

As described above, in a metal unit 100 and an electronic device including the metal unit 100 according to various embodiments of the present disclosure, a mechanical component to be soldered to a printed circuit board 21 is formed of the metal unit 100 having a plurality of layers. Thus, it is possible to improve strength and processability while enabling the mechanical component to be easily bonded to solder 10. Further, it is also possible to maintain the flatness of a thinned printed circuit board 21 and to reduce a unit cost.

As described above, according to various embodiments of the present disclosure, an electronic device may include a core metal layer that is mainly composed of iron (Fe), and an outer layer formed on at least one face of the core metal layer, and bonded to solder so as to be attached to a printed circuit board.

In various embodiments, the outer layer may include a first outer layer provided on a first face of the core metal layer, and a second outer layer provided on a second face of the core metal layer, which is opposite the first face of the core metal layer.

In various embodiments, the outer layer may include a first outer layer provided on a first face of the core metal layer, a second outer layer provided on a second face of the core metal layer, which is opposite the first face of the core metal layer, and a third outer layer provided on at least a portion of a third face of the core metal layer between the first face and the second face.

In various embodiments, the first outer layer, the core metal layer, and the second outer layer may form a thickness ratio of 0.15:0.70:0.15.

In various embodiments, the outer layer may include a first outer layer provided on a first face of the core metal layer, a second outer layer provided on a second face of the core metal layer, which is opposite the first face of the core metal layer, and a third outer layer provided on a third face of the core metal layer between the first face and the second face.

An accommodation groove may be provided in a fourth face of the core metal layer, which is opposite the third face of the core metal layer.

In various embodiments, the outer layer and the core metal layer may form a thickness ratio of 0.15:0.70.

In various embodiments, the core metal layer may be mainly composed of iron (Fe) and may contain about 17 to 19 wt % of chromium (Cr) and about 7 to 9 wt % of nickel (Ni).

In various embodiments, the outer layer may be made of an alloy, which contains about 40 to 70 wt % copper (Cu), about 5 to 30 wt % of nickel (Ni), and about 10 to 45 wt % of zinc (Zn), and may be configured to be bonded to the printed circuit board via the solder, which is made of an alloy, which contains tin (Sn)-silver (Ag)-copper (Cu).

In various embodiments, the outer layer may be made of nickel silver (German silver) or phosphor bronze.

In various embodiments, the metal unit may be formed into at least one of a shield can, a socket cover, a shield can-fixing unit, and a surface mount plate.

In various embodiments, the core metal layer and the outer layer may be bonded to each other through hot-rolling.

According to various embodiments of the present disclosure, a printed circuit board assembly structure may include a printed circuit board, a mechanical component bonded to the printed circuit board and formed of a metal unit having a plurality of metal layers, and solder bonding the mechanical component and the printed circuit board to each other.

The metal unit may include a core metal layer that is mainly composed of iron (Fe), and an outer layer formed on at least one face of the core metal layer, and bonded to the solder so as to be attached to the printed circuit board.

In various embodiments, the outer layer may include a first outer layer provided on a first face of the core metal layer, and a second outer layer provided on a second face of the core metal layer, which is opposite the first face of the core metal layer.

In various embodiments, the outer layer may include a first outer layer provided on a first face of the core metal layer, a second outer layer provided on a second face of the core metal layer, which is opposite the first face of the core metal layer, and a third outer layer provided on at least a portion of a third face of the core metal layer between the first face and the second face.

In various embodiments, the outer layer may include a first outer layer provided on a first face of the core metal layer, a second outer layer provided on a second face of the core metal layer, which is opposite the first face of the core metal layer, and a third outer layer provided on a third face of the core metal layer between the first face and the second face.

An accommodation groove may be provided in a fourth face of the core metal layer, which is opposite the third face of the core metal layer.

In various embodiments, the core metal layer may be mainly composed of iron (Fe) and may contain about 17 to 19 wt % of chromium (Cr) and about 7 to 9 wt % of nickel (Ni).

The outer layer may be made of an alloy, which contains about 40 to 70 wt % copper (Cu), about 5 to 30 wt % of nickel (Ni), and about 10 to 45 wt % of zinc (Zn), and may be configured to be bonded to the printed circuit board via the solder, which is made of an alloy, which contains tin (Sn)-silver (Ag)-copper (Cu).

In various embodiments, the outer layer may be made of nickel silver (German silver) or phosphor bronze.

In various embodiments, the mechanical component may be formed as at least one of a shield can, a socket cover, a shield can-fixing unit, and a surface mount plate.

According to various embodiments of the present disclosure, a printed circuit board assembly structure may include a housing, a display exposed through a first face of the housing, a printed circuit board positioned within the housing, a mechanical component bonded to the printed circuit board and formed of a metal unit having a plurality of metal layers, and solder bonding the mechanical component and the printed circuit board to each other.

The metal unit may include a core metal layer that is mainly composed of iron (Fe), and an outer layer formed on at least one face of the core metal layer, and bonded to the solder so as to be attached to the printed circuit board.

In various embodiments, the mechanical component may be formed as at least one of a shield can, a socket cover, a shield can-fixing unit, and a surface mount plate.

Although the present disclosure has been described with various embodiments, various changes and modifications may be suggested to one skilled in the art. It is intended that the present disclosure encompass such changes and modifications as fall within the scope of the appended claims.

What is claimed is:

1. A surface mount metal unit comprising:
   a core metal layer comprising iron (Fe); and
   an outer layer formed on at least one face of the core metal layer, and bonded to solder so as to be attached to a printed circuit board,
   wherein the outer layer comprises an alloy including copper (Cu)-nickel (Ni)-zinc (Zn).

2. The surface mount metal unit of claim 1, wherein the outer layer includes:
   a first outer layer provided on a first face of the core metal layer, and
   a second outer layer provided on a second face of the core metal layer, wherein the second face of the core metal layer is opposite the first face of the core metal layer.

3. The surface mount metal unit of claim 1, wherein the outer layer includes:
   a first outer layer provided on a first face of the core metal layer,
   a second outer layer provided on a second face of the core metal layer, wherein the second face of the core metal layer is opposite the first face of the core metal layer, and
   a third outer layer provided on at least a portion of a third face of the core metal layer, wherein the third face of the core metal layer is between the first face and the second face.

4. The surface mount metal unit of claim 2, wherein the first outer layer, the core metal layer, and the second outer layer form a thickness ratio of 0.15:0.70:0.15, respectively.

5. The surface mount metal unit of claim 1, wherein the outer layer includes:
   a first outer layer provided on a first face of the core metal layer,
   a second outer layer provided on a second face of the core metal layer, wherein the second face of the core metal layer is opposite the first face of the core metal layer,
   a third outer layer provided on a third face of the core metal layer, wherein the third face of the core metal layer is between the first face and the second face, and
   an accommodation groove provided on a fourth face of the core metal layer, wherein the fourth face of the core metal layer is opposite the third face of the core metal layer.

6. The surface mount metal unit of claim 5, wherein the outer layer and the core metal layer form a thickness ratio of 0.15:0.70, respectively.

7. The surface mount metal unit of claim 1, wherein the core metal layer comprises:
   iron (Fe),
   about 17 to 19 wt % of chromium (Cr), and
   about 7 to 9 wt % of nickel (Ni).

8. The surface mount metal unit of claim 1, wherein the outer layer comprises the alloy, wherein the alloy:
   comprises:
      about 40 to 70 wt % copper (Cu),
      about 5 to 30 wt % of nickel (Ni), and
      about 10 to 45 wt % of zinc (Zn), and
   is configured to be bonded to the printed circuit board via the solder, wherein the solder comprises an alloy that comprises tin (Sn)-silver (Ag)-copper (Cu).

9. The surface mount metal unit of claim 1, wherein the outer layer comprises nickel silver (German silver) or phosphor bronze.

10. The surface mount metal unit of claim 1, wherein the surface mount metal unit is formed into at least one of a shield can, a socket cover, a shield can-fixing unit, or a surface mount plate.

11. The surface mount metal unit of claim 1, wherein the core metal layer and the outer layer are bonded to each other through hot-rolling.

12. A printed circuit board assembly structure comprising:
    a printed circuit board; and
    a mechanical component bonded to the printed circuit board and formed of a metal unit including a plurality of metal layers,
    wherein the mechanical component is solder bonded to the printed circuit board,
    wherein the metal unit comprises:
       a core metal layer comprising iron (Fe), and
       an outer layer formed on at least one face of the core metal layer, and bonded to solder so as to be attached to the printed circuit board, and
    wherein the outer layer comprises an alloy including copper (Cu)-nickel (Ni)-zinc (Zn).

13. The printed circuit board assembly structure of claim 12, wherein the outer layer includes:
    a first outer layer provided on a first face of the core metal layer, and
    a second outer layer provided on a second face of the core metal layer, wherein the second face of the core metal layer is opposite the first face of the core metal layer.

14. The printed circuit board assembly structure of claim 12, wherein the outer layer includes:
    a first outer layer provided on a first face of the core metal layer,
    a second outer layer provided on a second face of the core metal layer, wherein the second face of the core metal layer is opposite the first face of the core metal layer, and
    a third outer layer provided on at least a portion of a third face of the core metal layer, wherein the third face of the core metal layer is between the first face and the second face.

15. The printed circuit board assembly structure of claim 12, wherein the outer layer includes:
    a first outer layer provided on a first face of the core metal layer,
    a second outer layer provided on a second face of the core metal layer, wherein the second face of the core metal layer is opposite the first face of the core metal layer, a third outer layer provided on a third face of the core metal layer, wherein the third face of the core metal layer is between the first face and the second face, and an accommodation groove provided on a fourth face of the core metal layer, wherein the fourth face of the core metal layer is opposite the third face of the core metal layer.

16. The printed circuit board assembly structure of claim 12, wherein:

the core metal layer comprises:
  iron (Fe),
  about 17 to 19 wt % of chromium (Cr), and
  about 7 to 9 wt % of nickel (Ni), and
the outer layer:
  comprises the alloy, the alloy comprising:
    about 40 to 70 wt % copper (Cu),
    about 5 to 30 wt % of nickel (Ni), and
    about 10 to 45 wt % of zinc (Zn), and
  is configured to be bonded to the printed circuit board via the solder, wherein the solder comprises an alloy, the alloy comprising tin (Sn)-silver (Ag)-copper (Cu).

17. The printed circuit board assembly structure of claim 12, wherein the outer layer comprises nickel silver (German silver) or phosphor bronze.

18. The printed circuit board assembly structure of claim 12, wherein the mechanical component is formed as at least one of a shield can, a socket cover, a shield can-fixing unit, or a surface mount plate.

19. An electronic device comprising:
a housing;
a display exposed through a first face of the housing;
a printed circuit board positioned within the housing; and
a mechanical component bonded to the printed circuit board and formed of a metal unit including a plurality of metal layers,
wherein the mechanical component is solder bonded to the printed circuit board,
wherein the metal unit includes:
  a core metal layer comprising iron (Fe), and
  an outer layer formed on at least one face of the core metal layer, and bonded to solder so as to be attached to the printed circuit board, and
wherein the outer layer comprises an alloy including copper (Cu)-nickel (Ni)-zinc (Zn).

20. The electronic device of claim 19, wherein the mechanical component is formed as at least one of a shield can, a socket cover, a shield can-fixing unit, or a surface mount plate.

* * * * *